United States Patent
Laighton et al.

(10) Patent No.: US 11,406,007 B2
(45) Date of Patent: Aug. 2, 2022

(54) RADIO FREQUENCY (RF) ENERGY TRANSMISSION LINE TRANSITION STRUCTURE

(71) Applicant: Raytheon Company, Waltham, MA (US)

(72) Inventors: Christopher M. Laighton, Boxborough, MA (US); Susan C. Trulli, Lexington, MA (US); Elicia K. Harper, Chelsea, MA (US)

(73) Assignee: RAYTHEON COMPANY, Waltham, MA (US)

( * ) Notice: Subject to any disclaimer, the term of this patent is extended or adjusted under 35 U.S.C. 154(b) by 105 days.

(21) Appl. No.: 16/794,487

(22) Filed: Feb. 19, 2020

(65) Prior Publication Data
US 2021/0259095 A1 Aug. 19, 2021

(51) Int. Cl.
*H01L 23/367* (2006.01)
*H05K 1/02* (2006.01)

(52) U.S. Cl.
CPC ......... *H05K 1/0243* (2013.01); *H01L 23/367* (2013.01); *H01L 2223/6683* (2013.01)

(58) Field of Classification Search
CPC ....... H05K 1/0243; H05K 2201/09481; H05K 1/115; H05K 1/111; H05K 1/117; H05K 2201/058; H05K 1/144; H01L 23/367; H01L 2223/6683; H01P 5/028
See application file for complete search history.

(56) References Cited

U.S. PATENT DOCUMENTS

| 5,545,924 A | 8/1996 | Contolatis et al. |
| 8,655,119 B2* | 2/2014 | Yagisawa ............. G02B 6/4201 385/14 |
| 2009/0066420 A1 | 3/2009 | Lopez |
| 2009/0091892 A1 | 4/2009 | Otsuka et al. |
| 2010/0285676 A1 | 11/2010 | Ikeuchi et al. |

(Continued)

FOREIGN PATENT DOCUMENTS

| CN | 205646074 U | 12/2016 |
| CN | 109449550 A | 8/2019 |
| TW | 201644092 A | 12/2016 |

OTHER PUBLICATIONS

PCT Notification of Transmittal of the International Search Report and the Written Opinion of the International Searching Authority, or the Declaration, PCT/US 2020/063698, dated Apr. 1, 2021, 1 page.

(Continued)

*Primary Examiner* — Ermias T Woldegeorgis
(74) *Attorney, Agent, or Firm* — Daly, Crowley, Mofford & Durkee, LLP (57) ABSTRACT

A radio frequency (RF) energy transmission line transition for coupling RF energy between a pair of RF transmission line sections disposed on intersecting surfaces of a corresponding one of a pair of conductive members, a first one of the pair of conductive members having a wall with a jog therein for receiving an end portion of a second one of the pair of conductive members, the end portion of an electrically conductive strip of the first one of the pair of radio frequency transmission line sections being disposed on, and electrically connected to, an electrically conductive strip of a second one of the pair of radio frequency transmission line sections.

20 Claims, 6 Drawing Sheets

(56) References Cited

U.S. PATENT DOCUMENTS

2013/0161076 A1    6/2013    Okada
2014/0085856 A1*  3/2014    Shirao .................... H01P 5/028
                                                          361/803
2017/0194686 A1    7/2017    Ito et al.
2019/0313522 A1    10/2019   Trulli et al.

OTHER PUBLICATIONS

PCT International Search Report, PCT/US 2020/063698, dated Apr. 1, 2021, 5 pages.
PCT Written Opinion of the International Searching Authority, PCT/US 2020/063698, dated Apr. 1, 2021, 10 pages.
Taiwan Office Action with English Translation and IPO Search Report, Application No. 109144308, dated Nov. 24, 2021, 8 pages.
Taiwan $2^{nd}$ Office Action (with English Translation) dated Aug. 6, 2021 for Taiwan Application No. 109144308; 8 Pages.
Response (with English Translation) to Taiwan $2^{nd}$ Office Action dated Aug. 6, 2021 for Taiwan Application No. 109144308; Response filed Oct. 22, 2021; 10 Pages.
Taiwan Allowance Decision (with English Translation) dated Mar. 28, 2022 for Taiwan Application No. 109144308; 3 Pages.
Response (with English Translation) to Taiwan Office Action dated Nov. 24, 2021 for Taiwan Application No. 109144308; Response filed Feb. 17, 2022; 11 Pages.

* cited by examiner

*FIG. 4A*
Section A-A

FIG. 4B
Section B-B

RADIO FREQUENCY (RF) ENERGY TRANSMISSION LINE TRANSITION STRUCTURE

TECHNICAL FIELD

This disclosure relates generally to radio frequency (RF) energy transmission line structures and more particularly to RF energy transmission line structures having a transition for coupling RF energy between a pair of RF transmission lines disposed in different elevations.

BACKGROUND OF THE INVENTION

As is known in the art, RF transitions are used to connect one RF transmission line to another RF transmission line. One technique uses wire bonding wires. The length of the wire bonds however adds inductance which may adversely affect the performance of the transition. As is also known is the art there is a trend to use additive manufacturing techniques (3D printing) to facilitate in the formation of RF transmission line structures.

SUMMARY OF THE INVENTION

In accordance with the present disclosure, a radio frequency (RF) energy transmission line transition is provided for coupling RF energy between a pair of RF transmission lines disposed at different elevations. The transition is coupled between the pair of transmission lines and includes a pair of RF transmission line sections disposed on intersecting surfaces of a corresponding one of a pair of conductive members, a first one of the pair of conductive members having a wall with a jog therein for receiving an end portion of a second one of the pair of conductive members, the end portion of an electrically conductive strip of the first one of the pair of radio frequency transmission line sections being disposed on, and electrically connected to, an electrically conductive strip of a second one of the pair of radio frequency transmission line sections.

In one embodiment the jog has orthogonal walls.

In one embodiment, the transition comprises: (a) A first one of the pair of radio frequency transmission line sections disposed on a first one of the pair of surfaces, comprising: a first electrically conductive member; a first dielectric disposed on the first electrically conductive member; and a first electrically conductive strip disposed on the first dielectric; (b) A second one of the pair of radio frequency transmission line sections disposed on a second one of the pair of surfaces, comprising: a second electrically conductive member having a first surface portion disposed on the first one of the pair of surfaces and a second surface portion disposed on a second one of the pair surfaces; a second dielectric disposed on the first surface portion and the second surface portion of the second electrically conductive member; a second electrically conductive strip having an end portion disposed on both: the first surface portion of the second dielectric and on the second surface portion of the second dielectric; and (c) wherein the end portion of the second electrically conductive strip disposed on the first surface of the second dielectric is disposed on and electrically connected to the first electrically conductive strip conductor.

In one embodiment, the second electrically conductive member comprises a block of conductive material, such block having a wall with a jog herein for receiving a front portion of the second one of the pair of radio frequency transmission line sections, a wall of the jog having the end portion of the second electrically conductive strip disposed on the first surface of the second dielectric is disposed on and electrically connected to the first electrically conductive strip conductor.

In one embodiment, a radio frequency transmission line transition is provided, comprising: (a) A first radio frequency transmission line section, comprising: a first electrically conductive member having a horizontal surface; a first dielectric disposed on the horizontal surface; and a first electrically conductive strip disposed on the horizontal surface of the dielectric; (b) A second radio frequency transmission line section, comprising: a second electrically conductive member having a vertical surface portion and a horizontal surface portion; a second dielectric disposed on the vertical surface portion and the horizontal surface portion of the second electrically conductive member, a second electrically conductive strip disposed on the vertical surface portion of and the horizontal portion of the second dielectric; and (c) a transition region wherein the end portion of the second electrically conductive strip disposed on the horizontal surface of the second dielectric is electrically connected to the first electrically conductive strip conductor.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

Referring now to FIGS. 1, 1A, 2, 2A, 3, a radio frequency transmission transition 10 is shown disposed on and bonded to an electrically conductive, baseplate or mounting medium, here for example a heat sink 11. The transition 10 couples an first, upper microwave transmission line section 14, here for example a microstrip transmission line, disposed in the X-Y (horizontal) plane at one elevation along a Z-axis to a second, lower microwave transmission line section 16, here for example a microstrip transmission line, disposed in the X-Y (horizontal) plane at different, here lower elevation along the Z-axis through a transition region, or section 18.

More particularly, the radio frequency transmission transition 10 includes a pair of electrically conductive blocks 13 and 15, which may also be thermally conductive. Block 13 has a vertical wall 17 with a jog 19 therein to receive a forward end of block 15, as shown. More particularly, the second radio frequency transmission line section 16, here for example, is a microstrip transmission line having: a first, horizontal, electrically conductive member, here the block 15, serving as a ground plane conductor for the second microstrip transmission line section 16, and having a horizontal surface 21 (disposed in the X-Y plane); a first dielectric 20, here a dielectric stripe, disposed on the horizontal surface 21 of block 15; and a first electrically conductive strip 22 disposed on a horizontal surface of the first dielectric 20, the first electrically conductive strip 22 serving as a signal conductor microstrip transmission line section 16.

Figure 1:
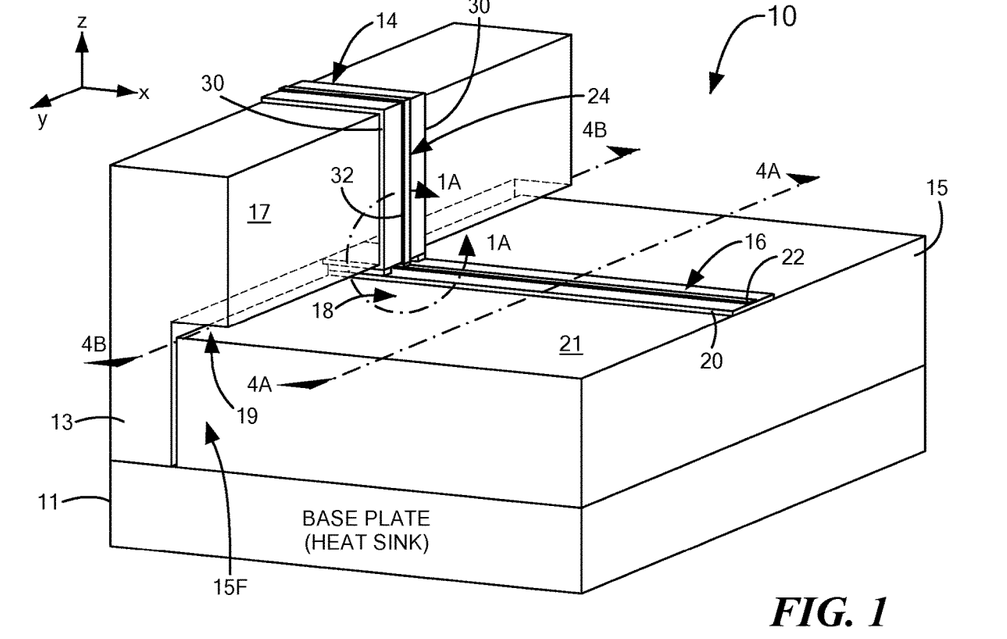
FIG. 1 is a perspective view of a radio frequency transmission transition, bonded to a heat sink, for coupling an upper microwave transmission line section to a lower microwave transmission line section according to the disclosure.
Figure 1A:
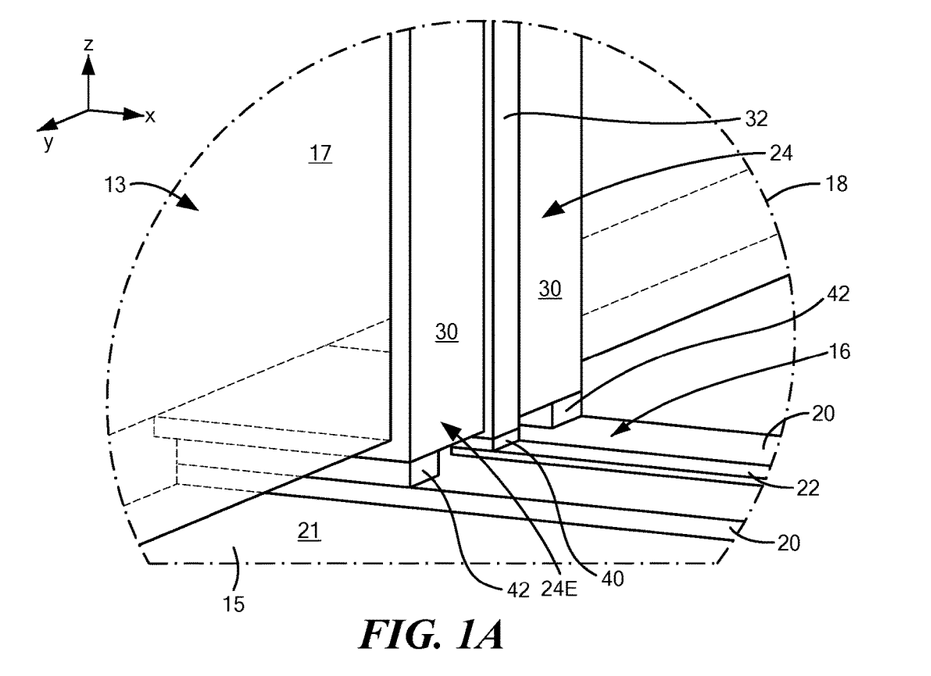
FIG. 1A is a perspective view of an enlarged portion of the transition of FIG. 1, such enlarged portion being encircled by the arrow 1A-1A in FIG. 1.
Figure 2:
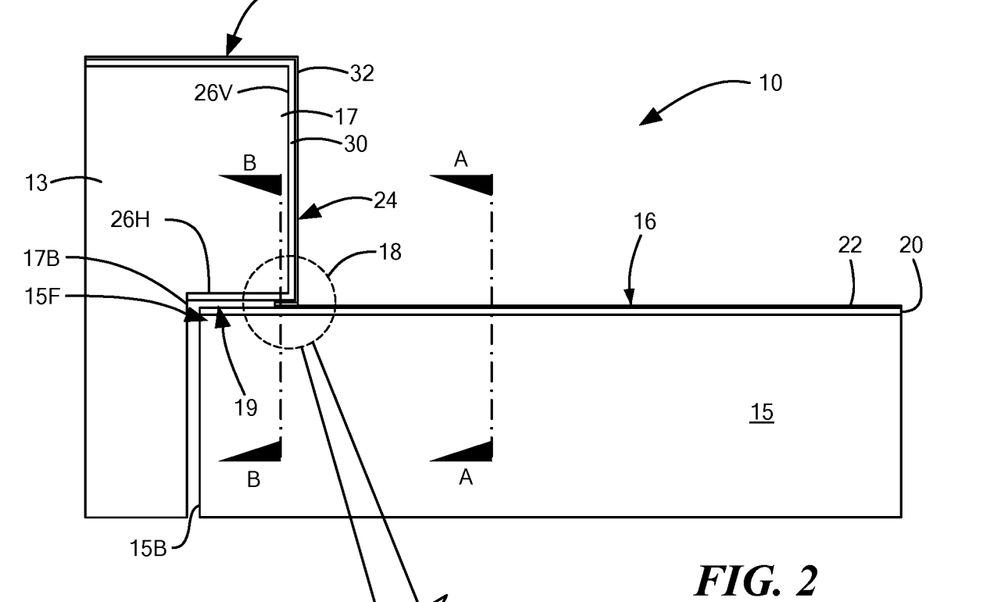
FIG. 2 is a cross-section view of the transition of FIG. 1 according to the disclosure.
Figure 2A:
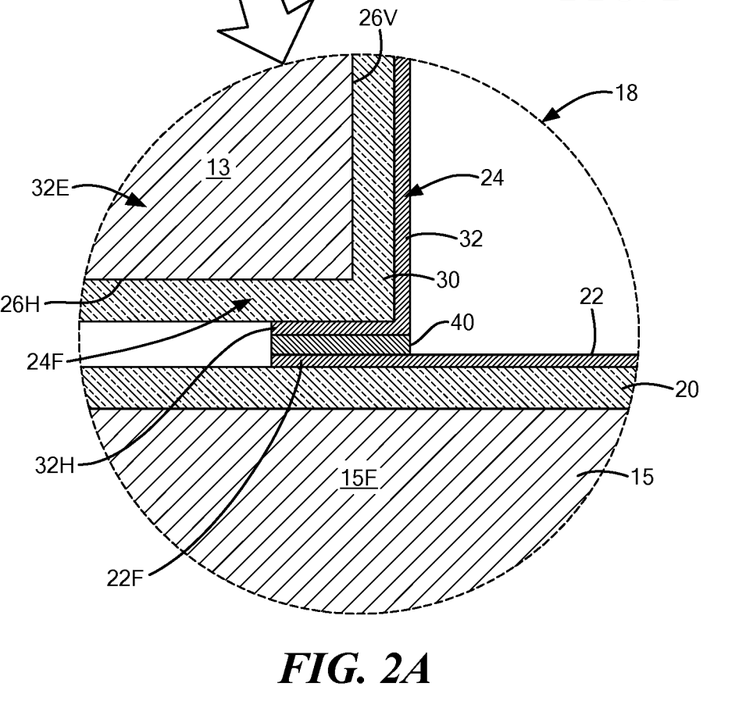
FIG. 2A is a cross section of an enlarged portion of the transition of FIG. 2, such enlarged portion being encircled by the arrow 2A-2A in FIG. 2.
Figure 3:
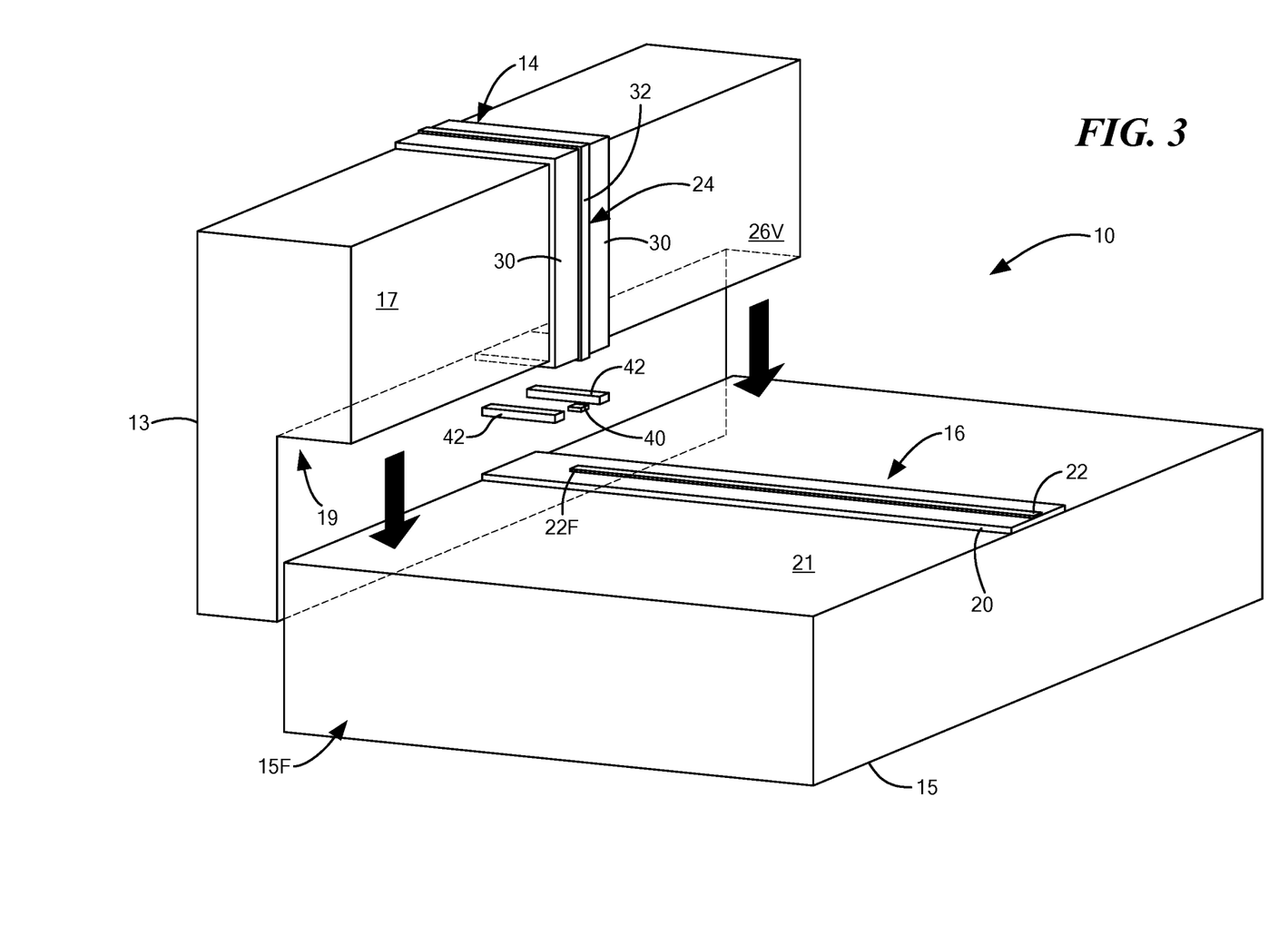
FIG. 3 is an exploded, perspective view of a radio frequency transmission transition, of FIG. 1 according to the disclosure.

It is noted that the transition section 18 (FIGS. 1, 1A, 2 and 2A) includes: the forward end 15F (FIG. 3) of block 15 disposed in jog 19 which is an extension of a ground plane conductor of the lower microstrip transmission line 16, the forward portion of dielectric 20 disposed in jog 19 which is an extension of a dielectric of the lower microstrip transmission line 16; and the forward portion of the electrically conductive strip conductor 22 which is an extension of the signal strip conductor of the lower microstrip transmission line, 16, as shown more clearly in FIGS. 2, 2A and 3).

The transition 10 includes a reverse facing (in FIG. 2) L-shaped, second radio frequency transmission line section 24, here for example, a microstrip transmission line having: a second electrically conductive member 26, here block 13, shown more clearly in FIGS. 2 and 2A), serving as a ground plane for the microstrip transmission line section 24, as well as serving as a ground plane conductor for the upper microstrip transmission line 14, having a vertical surface portion 26V (disposed in the X-Z plane), and a horizontal surface portion 26H disposed in the X-Y plane; a second dielectric 30, here a dielectric stripe, disposed on the vertical surface portion 26V and the horizontal surface portion 26H of the second electrically conductive member 26; and a second electrically conductive strip 32 disposed on a vertical surface portion 30V and the horizontal portion 30H of the second dielectric 30; serving as a signal conductor microstrip transmission line section 24. It is noted, as shown more clearly in FIGS. 1A and 2A, the transition 10 couples RF energy between the pair of RF transmission line sections 16, 24, such transmission line sections 16, 24 being disposed in intersecting planes, here for example, orthogonal planes. Thus the transition 10 is here a 90 degree transition.

Figure 4A:
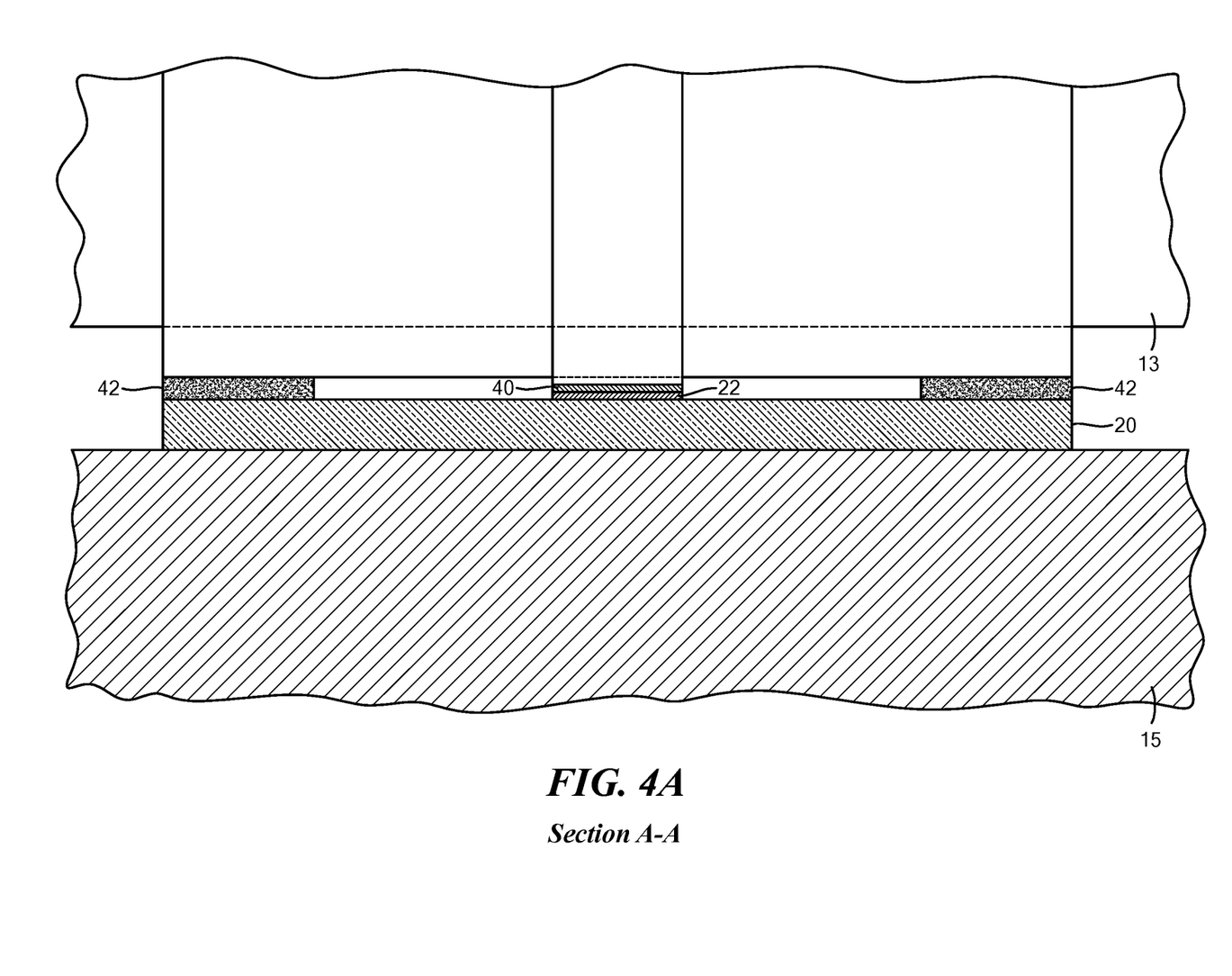
FIG. 4A is cross sectional view of the transition of FIG. 1, such cross section being taken along line 4A-4A of FIG. 1.
Figure 4B:
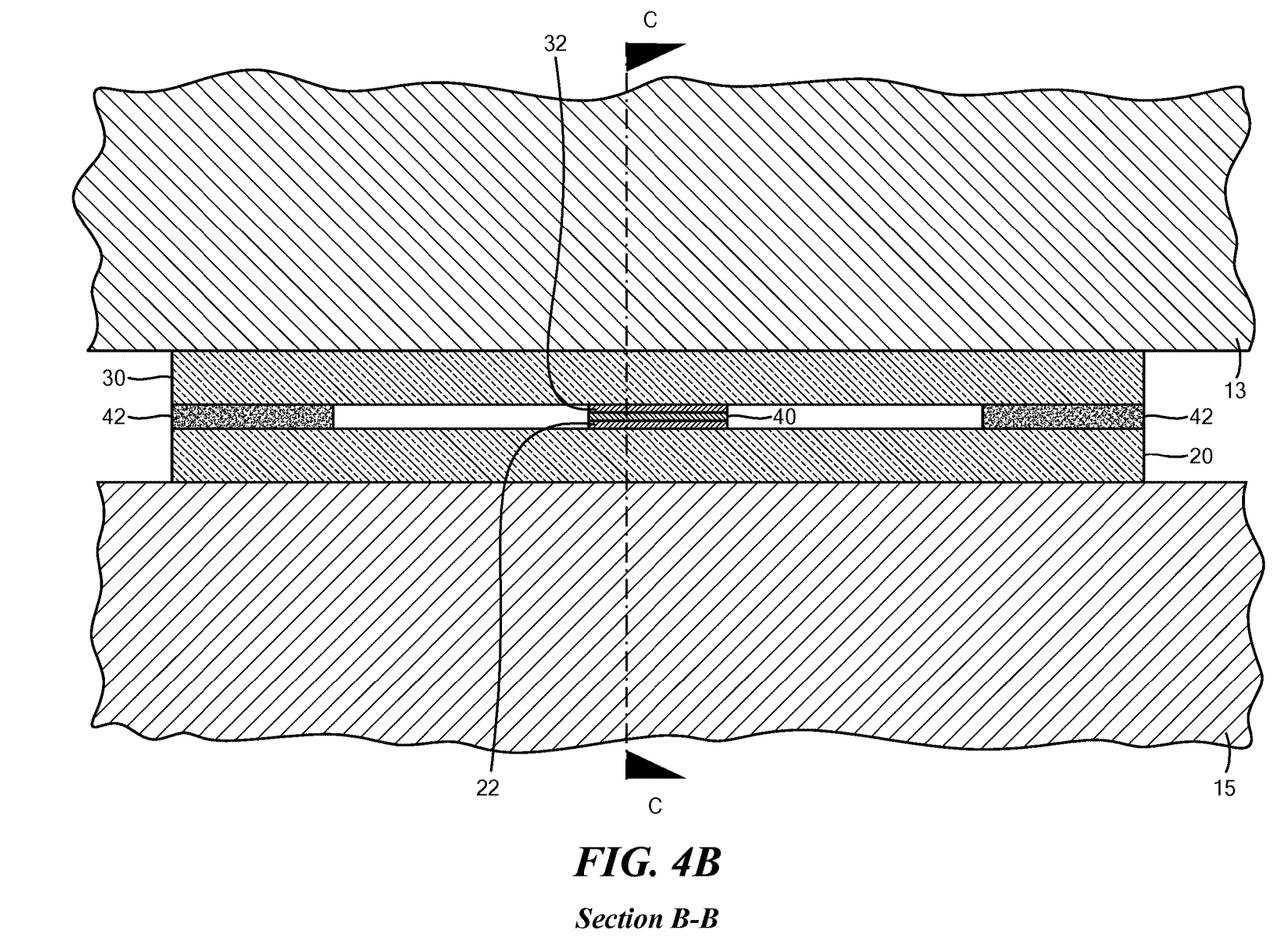
FIG. 4B is cross sectional view of the transition of FIG. 1, such cross section being taken along line 4B-4B of FIG. 1.

The transition section or region 18, shown more clearly in FIGS. 1A and 2A, includes the end portion 24F of the reverse facing (in FIG. 2) L-shaped, second radio frequency transmission line section 24 and the forward end 15F (FIG. 3) of block 15. The bottom portion of the horizontal portion 32H of strip conductor 32 is disposed on, and electrically connected to, the end portion 22F of the strip conductor 22 with here an electrically conductive bonding material 40 (FIG. 3), or a conductive ink when using additive manufacturing (3D printing) to fabricate the transition 10, as shown more clearly in FIGS. 1A, 3, 3A, 3B, 4A and 4B. It is also noted that a dielectrics attachment material 42 is also deposited on, or 3D printed on the dielectric 20, as shown more clearly in FIGS. 3, 4A and 4B. It is noted that the ends of the horizontal portion 32H of the strip conductor 32 and the front portion 22F of strip conductor 22 are spaced from the rear wall 15B of the block 15 and hence spaced from the vertical, jog portion 19 of wall 17 as shown in FIGS. 2, 2A and 3 to prevent them from contacting, and thereby electrically short circuiting, to the bottom, narrower portion of wall 17. It should be understood that other method are arrangements may be used to prevent them from contacting and thereby electrically short circuiting to the bottom, narrower portion (region 17B) of wall 17.

Figure 5A:
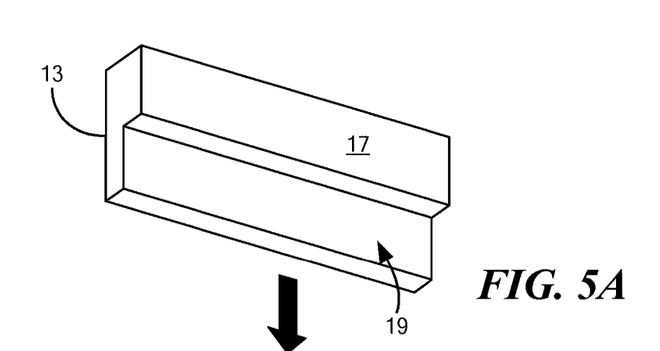
FIGS. 5A, 5B and 5C, show sequential steps used to process a block used in the transition of FIG. 1 according to the disclosure.
Figure 5B:
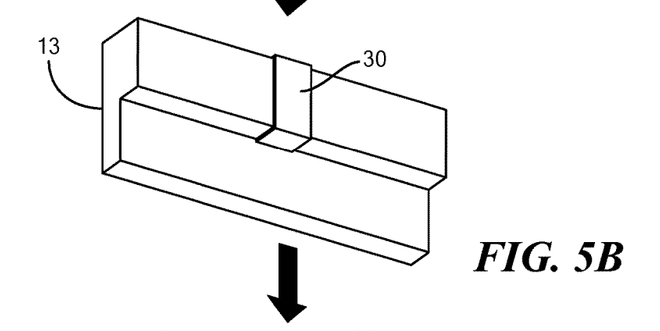
Figure 5C:
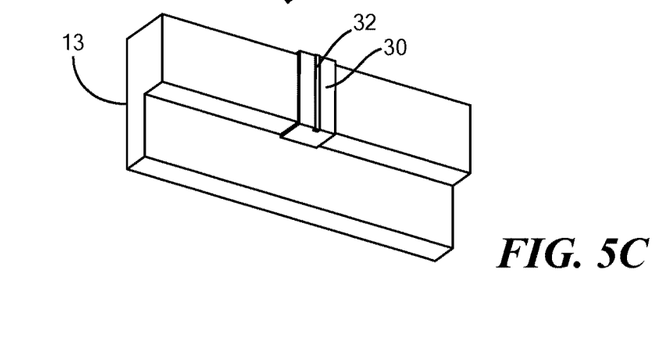
Figure 6A:
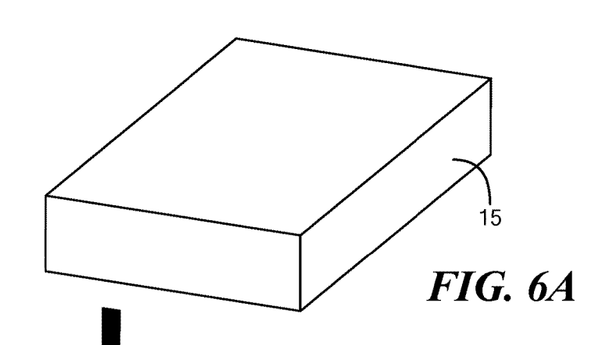
FIGS. 6A, 6B and 6C, show sequential steps used to process another block used in the transition of FIG. 1 according to the disclosure.
Figure 6B:
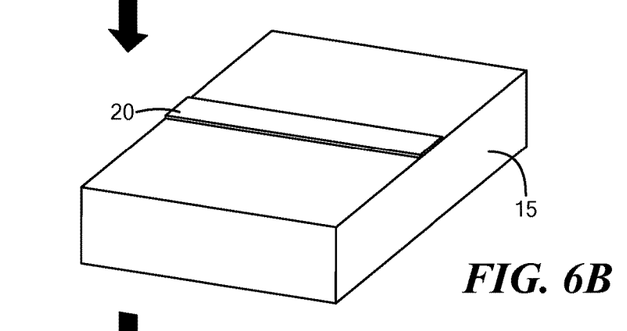
Figure 6C:
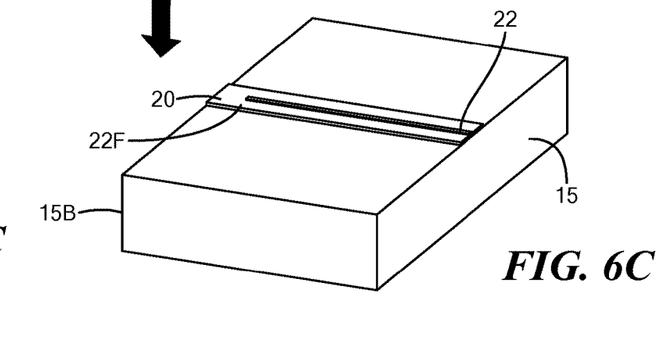

Referring now to FIGS. 5A, 5B and 5C, the sequential steps used to process block 13 are shown, and referring to FIGS. 6A, 6B and 6C, the sequential steps used to process block 15 are shown. Thus, referring to FIG. 5A the block 13 has the dielectric 3D printed as shown in FIG. 5B and the strip conductor 3D printed on the dielectric as shown in FIG. 5C. Thus, referring to FIG. 6A the block 15 has the dielectric 3D printed as shown in FIG. 6B and the strip conductor printed on the dielectric as shown in FIG. 6C. It is noted that the blocks 13, 15 may be created using Additive Manufacturing to create two pieces that can be overlapped/fit together to form a true 90 degree angle transition 10.

A number of embodiments of the disclosure have been described. Nevertheless, it will be understood that various modifications may be made without departing from the spirit and scope of the disclosure. For example, the upper and lower may be connected to electrical components such as Monolithic Microwave Integrated Circuits (MMICs) or may be used in other 3D structures such as described in Patent U.S. Application Publication No. 2019/0313522 A, entitled, "CIRCUIT SUPPORT AND COOLING STRUCTURE", Published Oct. 10, 2019, inventors Trulli et al, assigned to the same assignee as the present patent application. Further, other angles than 90 degrees may be used. Accordingly, other embodiments are within the scope of the following claims.

What is claimed is:

1. A radio frequency (RF) energy transmission line transition configured to couple RF energy between a pair of RF transmission line sections disposed on intersecting surfaces of a corresponding one of a pair of conductive members, a first one of the pair of conductive members having a first portion overhanging an end portion of a second one of the pair of conductive members, an end portion of an electrically conductive strip of the first one of the pair of RF transmission line sections being disposed on, and electrically connected to, an end portion of an electrically conductive strip of a second one of the pair of RF transmission line sections, wherein the electrically conductive strip of the first one of the pair of RF transmission line sections is entirely in contact with at least two surfaces of the first one of the pair of conductive members, wherein the at least two surfaces of the first one of the pair of conductive members comprise a first surface and a second surface orthogonal to the first surface.

2. The RF energy transmission line transition of claim 1, wherein an inner portion of the electrically conductive strip of the first one of the pair of RF transmission line sections electrically conducts along a first axis, wherein the electrically conductive strip of the second one of the pair of RF transmission line sections electrically conducts along a second axis, wherein the first axis is orthogonal to the second axis.

3. The RF energy transmission line transition of claim 2, wherein the at least two surfaces of the first one of the pair of conductive members further comprises a third surface opposite the first surface and orthogonal to the second surface,
  wherein a second inner portion of the electrically conductive strip of the first one of the pair of RF transmission line sections is attached to and extends along the third surface of the first portion of the first one of the pair of conductive members.

4. The RF energy transmission line transition of claim 3, wherein the third surface of the first portion of the first one of the pair of conductive members is a top surface of the first one of the pair of conductive members,
  wherein the first one of the pair of conductive members has a bottom surface, opposite the top surface, in contact with a heat sink.

5. The RF energy transmission line transition of claim 4, wherein the second one of the pair of conductive members has a bottom surface in contact with the heat sink.

6. The RF energy transmission line transition of claim 5, wherein the bottom surface of the first one of the pair of conductive members forms a first plane,
  wherein the bottom surface of the second one of the pair of conductive members forms a second a second plane,
  wherein the first plane and the second plane are the same plane.

7. The RF energy transmission line transition of claim 2, wherein the first portion of the first one of the pair of conductive members overhangs the end portion of the electronically conductive strip of the first one of the pair of RF transmission line sections and overhangs the end portion of the electrically conductive strip of the second one of the pair of RF transmission line sections.

8. The RF energy transmission line transition of claim 7, wherein the end portion of the electrically conductive strip of the first one of the pair of RF transmission line sections is attached to and extends along the first surface, and
  wherein the first inner portion of the electrically conductive strip of the first one of the pair of RF transmission line sections is attached to and extends along the second surface.

9. A energy transmission line transition configured to couple RF energy between a pair of RF transmission line sections disposed on intersecting surfaces, comprising:
  a first one of the pair of RF transmission line sections disposed on a first one of the pair of surfaces, comprising:
    a first electrically conductive member;
    a first dielectric disposed on the first electrically conductive member; and
    a first electrically conductive strip disposed on the first dielectric;
  a second one of the pair of RF transmission line sections disposed on a second one of the pair of surfaces, comprising:
    a second electrically conductive member having a first surface portion disposed on the first one of the pair of surfaces and a second surface portion disposed on a second one of the pair surfaces;
    a second dielectric disposed on the first surface portion and the second surface portion of the second electrically conductive member; and
    a second electrically conductive strip having an end portion disposed on both: the first surface portion of the second dielectric and on the second surface portion of the second dielectric,
  wherein the end portion of the second electrically conductive strip disposed on the first surface of the second dielectric is disposed on and electrically connected to the first electrically conductive strip conductor,
  wherein the second electrically conductive strip is entirely on at least two surfaces of the second electrically conductive member, and
  wherein the at least two surfaces of the second electrically conductive member comprise a first surface and a second surface that are orthogonal to each other.

10. The RF energy transmission line transition of claim 9, wherein the intersecting surfaces are orthogonal surfaces.

11. The RF energy transmission line transition of claim 10, wherein the second electrically conductive member has a bottom surface in contact with a heat sink.

12. The RF energy transmission line transition of claim 9, wherein the at least two surfaces of the second conductive member further comprise a third surface orthogonal to the second surface.

13. The RF energy transmission line transition of claim 12, wherein the first electrically conductive member has a bottom surface in contact with the heat sink.

14. The RF energy transmission line transition of claim 9, wherein the second electrically conductive member comprises a block of conductive material, such block having a wall with a jog therein for receiving a front portion of the second one of the pair of RF transmission line sections, a wall of the jog having the end portion of the second electrically conductive strip disposed on the first surface of the second dielectric is disposed on and electrically connected to the first electrically conductive strip conductor.

15. The RF energy transmission line transition of claim 9, wherein a portion of the second electrically conductive strip electrically conducts along a first axis,
  wherein the first electrically conductive strip electrically conducts along a second axis,
  wherein the first axis is orthogonal to the second axis.

16. A radio frequency (RF) transmission line structure, comprising:
  a first RF transmission line section, comprising:
    a first electrically conductive member having a horizontal surface;
    a first dielectric disposed on the horizontal surface; and
    a first electrically conductive strip disposed on the horizontal surface of the dielectric;
  a second RF transmission line section, comprising:
    a second electrically conductive member having a vertical surface portion and a horizontal surface portion;
    a second dielectric disposed on the vertical surface portion and the horizontal surface portion of the second electrically conductive member; and
    a second electrically conductive strip disposed on the vertical surface portion of and the horizontal portion of the second dielectric; and
  a transition region wherein an end portion of the second electrically conductive strip disposed on the horizontal surface of the second dielectric is electrically connected to the first electrically conductive strip conductor,
  wherein the second electrically conductive strip is entirely on at least two surfaces of the second electrically conductive member, and
  wherein the at least two surfaces of the second electrically conductive member comprise the vertical surface portion and the horizontal surface portion.

17. The RF energy transmission line transition of claim 16, wherein a portion of the second electrically conductive strip electrically conducts along a first axis,
   wherein the first electrically conductive strip electrically conducts along a second axis,
   wherein the first axis is orthogonal to the second axis.

18. The RF energy transmission line transition of claim 16, wherein the second electrically conductive member comprises a block of conductive material, such block having a wall with a jog therein for receiving a front portion of the second one of the pair of RF transmission line sections, a wall of the jog having the end portion of the second electrically conductive strip disposed on the first surface of the second dielectric is disposed on and electrically connected to the first electrically conductive strip conductor.

19. The RF energy transmission line transition of claim 16, wherein the horizontal surface portion is a first horizontal portion, and
   wherein the at least two surfaces of the second conductive member further comprise a second horizontal surface.

20. The RF energy transmission line transition of claim 16, wherein the second electrically conductive member has a bottom surface in contact with a heat sink, and
   wherein the first electrically conductive member has a bottom surface in contact with the heat sink.

* * * * *